United States Patent [19]

Nakayama et al.

[11] Patent Number: 4,900,582
[45] Date of Patent: Feb. 13, 1990

[54] METHOD FOR IMPROVING FILM QUALITY OF SILICA-BASED FILMS

[75] Inventors: Muneo Nakayama, Tokyo; Akira Hashimoto, Kanagawa; Toshihiro Nishimura, Kanagawa; Eiichi Kashiwagi, Kanagawa; Isamu Hijikata, Kanagawa, all of Japan

[73] Assignee: Tokyo Ohka Kogyo Co., Ltd., Kanagawa, Japan

[21] Appl. No.: 197,021

[22] Filed: May 20, 1988

[30] Foreign Application Priority Data

May 22, 1987 [JP]  Japan ................................ 62-125193

[51] Int. Cl.4 ............................................. B05D 3/06
[52] U.S. Cl. .................................. 427/54.1; 427/377; 427/299
[58] Field of Search ...................... 427/54.1, 377, 299

[56] References Cited

U.S. PATENT DOCUMENTS 4,605,567  8/1986  Müller et al. ..................... 427/54.1
4,702,936  10/1987  Maeda et al. ..................... 427/54.1
4,726,969  2/1988  Boccalon et al. ................. 427/54.1

Primary Examiner—Stanley Silverman
Attorney, Agent, or Firm—Birch, Stewart, Kolasch & Birch

[57] ABSTRACT

A coating solution for forming a silica-based film, having a given viscosity, is coated on a substrate such as a silicon wafer, this coating solution is dried to form a silica-based film, and this silica-based film is exposed to ultraviolet radiation in an atmosphere containing ozone at room temperature or while heating it preferably at a temperature of not more than 300° C., particularly at a temperature of from 50° to 200° C., by means of a heating member such as a hot plate.

The film quality of the silica-based film can be improved by exposing it to ultraviolet radiation in the atmosphere containing ozone.

22 Claims, 1 Drawing Sheet

METHOD FOR IMPROVING FILM QUALITY OF SILICA-BASED FILMS

BACKGROUND OF THE INVENTION

1. Field of the invention

The present invention relates to a method for improving film quality of silica-based films, and more particularly it is concerned with a method for improving film quality, that can improve the denseness and etching resistance of a silica-based film formed by coating on the surface of a substrate.

2. Description of the prior art

Silica-based films, the uses of which over recent years have over a great variety of purposes, are used in, for example, surface stabilizing films or layer insulation films of semiconductor devices; insulation films or orientation films of liquid crystal devices; and surface protective films for ceramics, plastics or metals.

The properties required in the silica-based films used for such purposes are such that the films are uniform as being free from any defects such as pinholes or cracks, have superior mechanical strength, and have superior chemical resistance and moisture resistance.

Of these properties, particularly the mechanical strength, chemical resistance and moisture resistance are known to be greatly affected by the denseness of the silica-based films themselves, and this denseness can be evaluated generally on the basis of increase in the refractive index of a film or decrease in the rate of film loss by etching treatment. There has been hitherto proposed a method in which a silica-based film is subjected to a heat treatment at a relatively high temperature of about 750° C. after coating in order to improve the denseness of the silica-based films (Japanese Pat. Publication No. 37353/1977), and this heat treatment is carried out usually in an atmosphere of oxygen, nitrogen or air.

Also proposed is a method in which a silica-based film is merely exposed to ultraviolet rays in place of such a heat treatment (Proceedings of the 31th symposium on semiconductors and integrated and circuits technology, Tokyo, Nov. 3 to 4, 1986; The electrochemical Society of Japan, pp. 121–126, "LOW TEMPERATURE PLANALIZATION TECHNIQUE FOR MULTILAYER INTERCONNECTIONS IN GaAs LSI PROCESS").

The conventional methods set out in the above can densify the silica-based films to a certain extent, but still tend to produce pinholes and cracks and have a poor film properties, so that it can not satisfy the properties required in the silica-based films utilized in various electronic parts.

SUMMARY OF THE INVENTION

To solve the above problems, the present invention was so made as to expose the silica-based film to ultraviolet radiation in an atmosphere containing ozone.

More specifically, a coating solution for forming a silica-based film, having a given viscosity, is coated on a substrate such as a silicon wafer, this coating solution is dried to form a silica-based film, and this silica-based film is exposed to ultraviolet radiation in an atmosphere containing ozone at room temperature or while heating it preferably at a temperature of not more than 300° C., particularly at a temperature of from 50° to 200° C., by means of a heating member such as a hot plate.

Figure 1:
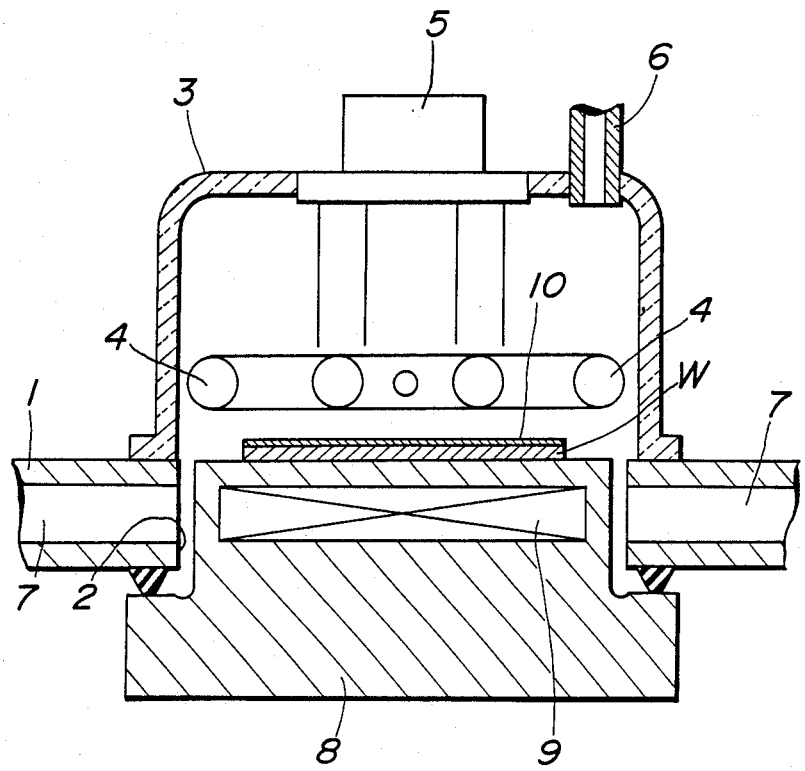
FIG. 1 is a view illustrating an example of an apparatus used in working the method of the present invention.

In the drawing, the numeral 3 denotes a chamber; 4, an ultraviolet radiation generating lamp; 6, an ozone-introducing pipe; and 10, a silica-based film; and W denotes a substrate.

DESCRIPTION OF THE PREFERRED EMBODIMENTS

Examples of the present invention will be described below in detail.

FIG. 1 illustrates an example of an apparatus used in working the method of the present invention, wherein a chamber 3 made of synthetic quartz or the like is provided on an opening 2 formed on a table 1, ultraviolet radiation generating lamps 4 are arranged in this chamber 3 and also an irradiation intensity monitor 5 and an ozone-introducing pipe 6 are installed in the chamber.

Here, the ultraviolet radiation generating lamp 4 may include, for example, low-pressure mercury lamps, high-pressure mercury lamps, ultra-high-pressure mercury lamps, xenon lamps, etc., and particularly preferred are those having an irradiation intensity of 20 mW/cm$^2$ or more at a wavelength of 253.7 nm.

The table 1 is also provided with an exhaust passageway 7 connecting through the outside, and a stage 8 capable of going up and down reaches the opening 2 from a lower part. On this stage 8, a substrate W comprising glass, ceramics, metals or a silicon wafer, etc. is placed on its top surface, and in the inside thereof embedded is a heating member such as a hot plate or the like capable of making temperature control.

On the surface of the substrate W, a silica-based film 10 is formed. This silica-based film 10 can be formed by using a method employing a silica-based film forming coating solution chiefly comprised of an organic solvent solution of a silicon compound (a coating process), as well as a CVD process, a sputtering process, a gaseous phase growth process, but particularly advantageous is the coating process as it can achieve a higher production efficiency as compared with other processes.

The silica-based film forming coating solution used in the above coating process is chiefly comprised of an organic solvent solution of a silicon compound, and useful as the silicon compound is a halogenated silane or an alkoxysilane. The halogenated silane is a compound represented by the formula:

$R_n SiX_{4-n}$ wherein X represents a halogen atom, R represents an alkyl group having 1 to 4 carbon atoms, an aryl group having 6 to 9 carbon atoms, a vinyl group, a glycidoxymethyl group, a glycidoxyethyl group or a glycidoxypropyl group, and n is an integer of 0 or 1 to 3, and may include, for example tetrabromosilane, tetrachlorosilane, dibromodichlorosilane, vinyltrichlorosilane, methyltrichlorosilane, ethyltrichlorosilane, phenyltrichlorosilane, dimethyldichlorosilane, diphenyldichlorosilane, diethyldichlorosilane, beta-glycidoxyethyltrichlorosilane, etc.

The alkoxysilane is a compound represented by the formula;

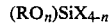
$(RO_n)SiX_{4-n}$ or $(RO_n)SiR'_{4-n}$ wherein X represents a halogen atom, R and R' each independently represent an alkyl group having 1 to 4 carbon atoms, an aryl group having 6 to 9 carbon atoms, a vinyl group, a glycidoxymethyl group, a glycidoxyethyl group, a glycidoxypropyl group, an acryloxymethyl group, an acryloxyethyl group, an acryloxypropyl group, a methacryloxymethyl group, a methacryloxyethyl group or a methacryloxypropyl group, and n is an integer of 0 or 1 to 4,
and may include, for example monomethoxytrichlorosilane, dimethoxydichlorosilane, trimethoxymonochlorosilane, monoethoxytrichlorosilane, diethoxydichlorosilane, triethoxymonochlorosilane, monoallyoxytrichlorosilane, diallyloxydichlorosilane, tetramethoxysilane, tetraethoxysilane, tetrapropoxysilane, tetrabutoxysilane, monomethyltrimethoxysilane, monoethyltrimethoxysilane, monoethyltrimethoxysilane, monoethyltriethoxysilane, monoethyltributoxysilane, monophenyltrimethoxysilane, monophenyltriethoxysilane, dimethyldimethoxysilane, diethyldiethoxysilane, diphenyldimethoxysilane, diphenyldiethoxysilane, diethyldibutoxysilane, vinylmethyldimethoxysilane, vinylethyldiethoxysilane, vinyltrimethoxysilane, vinyltriethoxysilane, vinyltributoxysilane, gamma-acryloxypropyltrimethoxysilane, gamma-acryloxypropyltriethoxysilane, beta-methacryloxyethyltrimethoxysilane, beta-methacryloxyethyltriethoxysilane, beta-glycidoxyethyltrimethoxysilane, beta-glycidoxyethyltriethoxysilane, gamma-glycidoxypropyltrimethoxysilane, gamma-glycidoxypropyltriethoxysilane, etc.

The halogenated silanes and alkoxysilanes described above may be used alone or by mixing two or more kinds.

These silicon compounds are dissolved in an organic solvent and prepared as a coating solution. Suited as the organic solvent used are alcohols, esters, ketones and aromatic hydrocarbons, and the alcohols may include, for example, methanol, ethanol, propanol, butanol, cyclohexanol, benzyl alcohol, dimethylolbenzene, furfurylalcohol, tetrahydrofurfurylalcohol, diacetone alcohol, ethylene glycol monoalkyl ethers, diethylene glycol monoalkyl ethers, triethylene glycol monoalkyl ethers, propylene glycol monoalkyl ethers, etc., and the esters may include, for example, acetic acid alkyl esters, diethylene glycol monoalkyl ether acetates, triethylene glycol monoalkyl ether acetates, propylene glycol monoalkyl ether acetates, acetoacetic acid ethyl esters, lactic acid alkyl esters, benzoic acid alkyl esters, benzyl acetate, glycerol diacetate, etc. Also, the ketones may include, for example, acetone, methyl ethyl ketone, cyclohexanone, acetylacetone, isophorone, diethyl ketone, methyl isobutyl ketone, methyl n-butyl ketone, acetonylacetone, etc., and the aromatic hydrocarbons may include, for example, benzene, toluene, xylene, ethylbenzene, diethylbenzene, cumene, tetralin, etc. These may be used alone or by mixing two or more kinds.

It is also possible to use as the silica-based film forming coating solution a solution obtained by dissolving the above silicon compound in an organic solvent followed by concentration. In usual cases, however, preferred is to use as the silica-based film forming coating solution a solution obtained by preparing an organic solvent solution containing a hydrolyzate of the above silicon compound followed by concentration.

The method of preparing the organic solvent solution containing the hydrolyzate may include, for example, a method in which an organic acid or an inorganic acid is added in an organic solvent solution of the silicon compound or an method in which an alcohol is reacted with a reaction product of a halogenated silane with a carboxylic acid (Japanese Pat. Publication No. 16488/1977), as well as a method in which an inorganic acid is added in a mixture comprising an alkoxysilane, an organic carboxylic acid and an alcohol (Japanese Pat. Publication No. 34234/1981), etc. The hydrolyzate of the silicon compound, readily prepared by these methods, may be dissolved in the above organic solvent usually in concentration of from 5 to 50% by weight, preferably from 10 to 30% by weight, and subsequently the resulting solution is subjected to dehydration condensation reaction at temperatures less than 200° C. (under reduced pressure if necessary) and adjusted to have a viscosity of about $2\times10^{-3}$ to 0.2 Pa.s, whereby there can be obtained a silica-based film forming coating solution suited in practical use.

To this silica-based film forming coating solution, it is also possible to optionally add as a vitrifying agent, halides, hydroxides, oxides, inorganic acid salts, organic acid salts, alkoxy compounds, chelating compounds and organic metal compounds of metals such as Li, B, Na, K, Fe, Ni, Cr, Mg, Al, P, Ca, Ti, Zr, Mo, In, Sn, Sb, Ba, Ta, W, Mn, Pb, Au and Ce. These may preferably be added in an amount of from 1 to 50% by weight in terms of metal, based on the silicon compound.

The silica-based film forming coating solution as described above is coated on the substrate W comprising glass, ceramics, metals or a silicon wafer, etc. according to a conventional method such as a spinner method, a dipping method, a spray method and a printing method to have a prescribed film thickness, followed by drying at temperatures of not more than 200° C. to form the silica-based film 10 on the substrate W.

Subsequently, a treatment to expose the above silica-based film 10 to ultraviolet radiation in an atmosphere containing ozone is applied to the above silica-based film. To make exposure to the ultraviolet radiation, the stage on which the substrate W is placed is elevated until the opening 2 is hermetically closed, and thereafter a gas containing ozone in a given amount is introduced into the chamber 3 through the introducing pipe 6, where the ultraviolet radiation is irradiated at room temperature or while heating the silica film preferably at a temperature of not more than 300° C., particularly at a temperature of from 50° to 200° C., by means of a heating member such as a hot plate. Here, the ozone is fed in the form that it has been mixed with nitrogen gas, oxygen gas, a mixed gas of nitrogen and oxygen, air, or the like, and the ozone may preferably be used in an amount of not less than 1% by weight. To feed such a gas containing ozone, usually used is an ozone generator, which ozone generator commercially available at present time can only feed 10% by weight of ozone at maximum. Since, however, the effect according to the present invention has been confirmed to tend to become better with increase in the amount of ozone within the range of from 1 to 10% by weight, the amount of ozone is presumed to be more preferred as it becomes greater. The gas containing this ozone may also be fed in the state that the inside of the chamber 3 has been evacuated.

A silica-based film improved in the denseness can be obtained by applying the treatment as described above, but its effect can be further improved by carrying out a heat treatment in an inert gas such as nitrogen after the above treatment.

Examples and Comparative Examples will be described below with more specific figures to make clearer the effect from the method of the present invention.

EXAMPLE 1

OCD Type-6 (available from Tokyo Ohka Kogyo Co., Ltd.) which is a silica-based film forming coating solution containing a hydrolyzate of alkoxysilane was coated on a 4-inch silicon wafer according to a spinner method for 20 seconds at 3,000 rpm, and dried for 30 minutes at 140° C. Thereafter the resulting silicon wafer was place on a stage of TVC-5002 (available from Tokyo Ohka Kogyo Co., Ltd..) which is an ultraviolet treatment apparatus having a treatment chamber provided with a gas inlet and a gas outlet and the stage capable of hermetically closing the treatment chamber by its elevation and provided with a hot plate as a heating member, and heated to 200° C. Thereafter the stage was elevated to close the treatment chamber, and then the silica-based film was exposed for 30 minutes to ultraviolet radiation having an irradiation of 20 mW/cm$^2$ at a wavelength of 253.7 nm while feeding from the gas inlet a gas comprising 10% by weight of ozone contained in oxygen by means of an ozone generator provided outside. Subsequently, the resulting silicon wafer was subjected to heat treatment for 30 minutes at 400° C. in nitrogen gas. The silica-based film thus obtained was free from generation of pinholes or cracks and uniform. Also, to examine the denseness, the silica-based film was dipped in an aqueous 0.25% by weight HF solution for 3 minutes at 25° C., and the quantity of film loss was measured form the change in the film thickness observed before and after the dipping to obtain the results as shown in the table.

EXAMPLE 2

Following the same procedures as in Example 1 except that used were OCD Type-1 (available from Tokyo Ohka Kogyo Co., Ltd..) which is a silica-based film forming coating solution containing a hydrolyzate of halogenated silane and a gas comprising 2% by weight of ozone contained in oxygen, there was obtained a silica-based film being free from generation of pinholes or cracks and uniform. The quantity of film loss was also measured in the same manner as in Example 1 to obtain the results as shown in the table.

EXAMPLE 3

Following the same procedures as in Example 1 except that used were OCD Type-1 (available from Tokyo Ohka Kogyo Co., Ltd..) which is a silica-based film forming coating solution containing a hydrolyzate of alkoxysilane and also containing 14.9% by weight of As$_2$O$_3$ based on SiO$_2$ calculated from this alkoxysilane, and a gas comprising 6% by weight of ozone contained in oxygen, there was obtained a silica-based film being free from generation of pinholes or cracks and uniform. The quantity of film loss was also measured in the same manner as in Example 1 to obtain the results as shown in the table.

EXAMPLE 4

Following the same procedures as in Example 1 except that used were OCD Type-2 (available from Tokyo Ohka Kogyo Co., Ltd..) which is a silica-based film forming coating solution containing a hydrolyzate of alkoxysilane and also containing 14.9% by weight of As$_2$O$_3$ based on SiO$_2$ calculated from this alkoxysilane, and a gas comprising 6 % by weight of ozone contained in oxygen, there was obtained a silica-based film being free from generation of pinholes or cracks and uniform. The quantity of film loss was also measured in the same manner as in Example 1 to obtain the results as shown in the table.

EXAMPLE 5

OCD Type-6 (available from Tokyo Ohka Kogyo Co., Ltd.) which is a silica-based film forming coating solution containing a hydrolyzate of alkoxysilane was coated on a 4-inch silicon wafer according to a spinner method for 20 seconds at 3,000 rpm, and dried for 30 minutes at 140° C. Thereafter the resulting silicon wafer was place on a stage of TVC-5002 (available from Tokyo Ohka Kogyo Co., Ltd..) which is an ultraviolet treatment apparatus having a treatment chamber provided with a gas inlet and a gas outlet and the stage capable of hermetically closing the treatment chamber by its elevation and provided with a hot plate as a heating member, and heated to 80° C. Thereafter the stage was elevated to close the treatment chamber, and then the silica-based film was exposed for 30 minutes to ultraviolet radiation having an irradiation of 20 mW/cm$^2$ at a wavelength of 253.7 nm while feeding from the gas inlet a gas comprising 10% by weight of ozone contained in oxygen by means of an ozone generator provided outside. Subsequently, the resulting silicon wafer was subjected to heat treatment for 30 minutes at 400° C. in nitrogen gas. The silica-based film thus obtained was free from generation of pinholes or cracks and uniform. Also, to examine the denseness, the silica-based film was dipped in an aqueous 0.25% by weight HF solution for 3 minutes at 25° C., and the quantity of film loss was measured from the change in the film thickness observed before and after the dipping to obtain the results as shown in the table.

COMPARATIVE EXAMPLES 1 to 5

In Examples 1 to 5, the treatment to expose the silica-based films to the ultraviolet radiation in the ozone-containing atmosphere by using the ultraviolet treatment apparatus was not carried out and only the heat treatment for 30 minutes at 400° C. in the nitrogen gas atmosphere was applied to obtain silica-based films, which were dipped in an aqueous 0.25% by weight HF solution for 3 minutes at 25° C., and the quantity of film loss was measured from the change in the film thickness observed before and after the dipping to obtain the results as shown in the table.

TABLE

| Film loss quantity of silica-based films applied with ultraviolet exposure treatment in ozone-containing atmosphere (A/min) | | Film loss quantity of silica-based films not applied with the same treatment (A/min) | |
|---|---|---|---|
| Example: | | Comparative Example: | |
| 1 | 193 | 1 | 1,032 |
| 2 | 172 | 2 | 274 |

TABLE-continued

| Film loss quantity of silica-based films applied with ultraviolet exposure treatment in ozone-containing atmosphere (A/min) Example: | | Film loss quantity of silica-based films not applied with the same treatment (A/min) Comparative Example: | |
|---|---|---|---|
| 3 | 298 | 3 | 1,096 |
| 4 | 194 | 4 | 466 |
| 5 | 213 | 5 | 1,100 |

As will be clear from the above description, it is possible according to the present invention to obtain silica-based films being free from any defects such as pinholes or cracks and having superior mechanical strength, chemical resistance and moisture resistance, by exposing the silica-based film to ultraviolet radiation in an atmosphere containing ozone.

What is claimed is:

1. A method of improving the quality of a silica-based film, which comprises:
    forming a silica-based film by coating on a substrate a film forming coating solution, wherein said coating solution comprises an organic solvent solution of a silicon compound; and
    exposing said silica based film to ultraviolet radiation in an atmosphere containing ozone in an amount of not less than 1% by weight.

2. The method of claim 1, wherein said silica compound is selected from a halogenated silane represented by the formula:

$R_nSiX_{4-n}$ wherein X represents a halogen atom, R represents an alkyl group having 1 to 4 carbon atoms, an aryl group having 6 to 9 carbon atoms, a vinyl group, a glycidoxymethyl group, a glycidoxyethyl group or a glycidoxypropyl group, and n is an integer of 0 or 1 to 3,
and an alkoxysilane represented by the formula:
    $(RO_n)SiX_{4-n}$ or $(RO_n)SiR'_{4-n}$ wherein X represents a halogen atom, R and R' each independently represent an alkyl group having 1 to 4 carbon atoms, an aryl group having 6 to 9 carbon atoms, a vinyl group, a glycidoxymethyl group, a glycidoxyethyl group, a glycidoxypropyl group, an acryloxymethyl group, an acryloxyethyl group, an acryloxypropyl group, a methacryloxymethyl group, a methacryloxyethyl group or a methacryloxypropyl group, and n is an integer of 0 or 1 to 4.

3. The method of claim 1, wherein said silica-based film is exposed to ultraviolet radiation in the atmosphere containing ozone, at room temperature or while heating said film at a temperature of not more than 300° C.

4. The method of claim 3, wherein the heating is carried out at a temperature of from 50° to 200° C.

5. The method of claim 1, wherein said ozone is mixed with a gas selected from the group consisting of nitrogen gas, oxygen gas, a mixed gas of nitrogen and oxygen and air, in an amount of not less than 1% by weight.

6. The method of claim 5, wherein said ozone is mixed with said gas in an amount of from 1 to 10% by weight.

7. The method of claim 1, wherein said film forming coating solution comprises an organic solvent solution containing a hydrolyzate of the silicon compound.

8. The method of claim 2, wherein said film forming coating solution comprises an organic solvent solution containing a hydrolyzate of the silicon compound.

9. The method of claim 7, wherein said film forming coating solution is prepared by dissolving said hydrolyzate of the silicon compound in said organic solvent at a concentration of from 5 to 50% by weight, subjecting the resulting solution to dehydration condensation reaction conditions, and adjusting the viscosity of the solution to about $2 \times 10^{-3}$ to 0.2 Pa.

10. The method of claim 9, wherein said concentration of said hydrolyzate of the silicon compound in said organic solvent is from 10 to 30% by weight, and wherein said dehydration condensation reaction conditions include a temperature of less than 200° C.

11. The method of claim 9, wherein said film forming coating solution further comprises a vitrifying agent in an amount of from 1 to 50% by weight in terms of metal based on the silicon compound.

12. The method of claim 10, wherein said film forming coating solution further comprises a vitrifying agent in an amount of from 1 to 50% by weight in terms of metal based on the silicon compound.

13. The method of claim 1, wherein said silica-based film is dried at temperatures of not more than 200° C. before said silica-based film is exposed to ultraviolet radiation in an atmosphere containing ozone.

14. The method of claim 1, wherein said silica-based film is further heat-treated in an insert gas after being exposed to ultraviolet radiation in an atmosphere containing ozone.

15. The method of claim 14, wherein said inert gas is nitrogen.

16. The method of claim 3, wherein said ozone is mixed with a gas selected from the group consisting of nitrogen gas, oxygen gas, a mixed gas of nitrogen and oxygen and air, in an amount of not less than 1% by weight.

17. The method of claim 16, wherein the heating is carried out at a temperature of from 50 to 200° C.

18. The method of claim 10, wherein the heating is carried out at a temperature of from 50° to 200° C.

19. The method of claim 10, wherein said ozone is mixed with said gas in an amount of from 1 to 10% by weight.

20. A method of improving the quality of a silica-based film, which comprises:
    forming a silica based film by coating on a substrate a film forming coating solution, wherein said coating solution comprises an organic solvent solution of a silicon compound; and
    exposing said silica-based film to ultraviolet radiation in an atmosphere containing ozone in an amount of not less than 1% by weight, wherein said silica-based film is exposed to the ultraviolet radiation at room temperature or while heating said film to a temperature of not more than 300° C., and wherein said ozone is mixed with a gas selected from the group consisting of nitrogen gas, oxygen gas, a mixed gas of nitrogen and oxygen, and air.

21. A method of improving the quality of silica-based film, which comprises:
forming a silica based film by coating on a substrate a film forming coating solution, wherein said coating solution comprises an organic solvent solution of a silicon compound; and
exposing said silica-based film to ultraviolet radiation in an atmosphere containing ozone in an amount of not less than 1% by weight, wherein said ozone is mixed with a gas selected from the group consisting of nitrogen gas, oxygen gas, a mixed gas of nitrogen and oxygen, and air, and wherein said ozone is produced by means of an ozone generator.

22. A method of improving the quality of a silica-based film, which comprises:
forming a silica-based film by coating on a substrate a film forming coating solution, wherein said coating solution comprises an organic solvent solution of a silicon compound;
placing said substrate formed thereon with said silica-based film in a chamber;
introducing into said chamber a gas containing ozone produced outside said chamber, wherein said ozone is in an amount of not less than 1% by weight; and
exposing said silica-based film to ultraviolet radiation in said gas and said chamber.

* * * * *